United States Patent [19]
Brugge

[11] Patent Number: 5,702,870
[45] Date of Patent: Dec. 30, 1997

[54] INTEGRATED-CIRCUIT VIA FORMATION USING GRADIENT PHOTOLITHOGRAPHY

[75] Inventor: Hunter Barham Brugge, San Antonio, Tex.

[73] Assignee: VLSI Technology, Inc., San Jose, Calif.

[21] Appl. No.: 628,768

[22] Filed: Sep. 9, 1996

Related U.S. Application Data

[63] Continuation of Ser. No. 113,498, Aug. 27, 1993, abandoned.

[51] Int. Cl.[6] .......... G03C 5/16; H01L 21/441; H01L 21/473; C23F 1/00
[52] U.S. Cl. .......... 430/314; 430/318; 156/651.1; 156/653.1; 156/659.11; 156/661.11; 437/189; 437/195; 437/231
[58] Field of Search .......... 430/314, 315, 430/317, 318, 324; 437/189, 195, 231; 156/651.1, 653.1, 659.11, 661.11

[56] References Cited

U.S. PATENT DOCUMENTS

| | | | |
|---|---|---|---|
| 4,451,326 | 5/1984 | Gwozdz | 430/317 |
| 4,732,658 | 3/1988 | Lee | 430/317 |
| 4,756,795 | 7/1988 | Bakos et al. | 430/318 |
| 4,775,550 | 10/1988 | Chu et al. | 427/38 |
| 4,824,767 | 4/1989 | Chambers et al. | 430/314 |
| 4,944,836 | 7/1990 | Beyer et al. | 156/645 |
| 4,954,423 | 9/1990 | McMann et al. | 430/317 |
| 5,117,276 | 5/1992 | Thomas et al. | 357/71 |
| 5,143,820 | 9/1992 | Kotecha et al. | 430/314 |
| 5,213,916 | 5/1993 | Cronin et al. | 430/5 |

Primary Examiner—George F. Lesmes
Assistant Examiner—Bernard P. Codd
Attorney, Agent, or Firm—Clifton L. Anderson

[57] ABSTRACT

A method of forming a metal interconnect structure for a CMOS integrated circuit provides for deposition of via metal prior to formation of an intermetal dielectric. After a submetal dielectric is deposited, lower metal and via metals are deposited. Gradient photolithography is used to define a via pattern and a lower metal pattern in a positive photoresist. After etching, the lower metal assumes the lower metal pattern and the via metal assumes the via pattern. A three-layer intermetal dielectric includes a spin-on glass sandwiched between two deposited silicon dioxide layers. The resulting structure is polished until at least some of the vias are exposed. Other vias can be exposed by via apertures that are define photolithographically. An upper metal layer is then deposited, filling the via apertures. The upper metal is then patterned to complete the interconnect structure. This method provides that via metal is insulated from spin-on glass moisture by the deposited oxide. Prior art problems with metal interconnect integrity due to misalignment, poor step coverage, and via poisoning are eliminated in some cases and reduced in others.

4 Claims, 6 Drawing Sheets

INTEGRATED-CIRCUIT VIA FORMATION USING GRADIENT PHOTOLITHOGRAPHY

This is a continuing application of U.S. patent application Ser. No. 08/113,498, filed Aug. 27, 1993, now abandoned.

BACKGROUND OF THE INVENTION

The present invention relates to integrated circuit fabrication and, more particularly, to the fabrication of interconnected metal layers using photolithography. A major objective of the present invention is to provide for enhanced connectivity between metal interconnect layers.

Much of modern progress has been based on circuits of increasing speed and integration. The increasing speed and integration have been enabled by advances in semiconductor processing technology that has provided smaller integrated circuit elements and denser circuit layouts.

A typical integrated circuit includes a large number of transistors, each including positively doped (p-type) and negatively doped (n-type) regions in a semiconductor substrate. Silicon is the prevalent semiconductor material. Interconnections among the transistors can be provided by a metal interconnect structure that contains metal layers patterned to define desired electrical conductors. Crossovers can be provided using plural patterned metal layers insulated from each other by intermetal dielectric layers. Connections between adjacent metal layers are provided by metal vias through the intermediate respective intermetal dielectric layer.

The metal interconnect structure can be electrically isolated from the circuit elements by a submetal dielectric. Metal contacts extend from the lowest-level metal and through the submetal dielectric to provide electrical access to the circuit elements.

Photolithography is used at all stages of integrated circuit fabrication. Photolithography involves the exposure and development of photoresist to define masks that permit various treatments to be applied selectively. The mask can be used to protect some areas while unmasked areas are exposed to oxide growth, depositions, dopant implants, removal by etching, etc. Photolithography is used to define electrical interconnections between circuit elements, as well as the circuit elements themselves. Specifically, metal interconnect patterns of each metal layer are defined photolithographically, as are the locations of contacts to the circuit elements and vias between metal patterns.

The photoresist mask can be defined using either a positive photoresist or a negative photoresist. In either case, photoresist is applied over a layer of material, and the photoresist is exposed to a light pattern. In the case of the positive photoresist, the areas to be removed are exposed to light; the light "softens" the exposed areas, which can then be removed during development. In the case of negative photoresist, the areas to remain are exposed to light; the light "hardens" the exposed photoresist, which remains as the unexposed photoresist is removed during development.

The exposures for successive photolithographic procedures must be precisely registered; otherwise, the patterns they impose are not aligned. Misalignment can result in performance impairment and/or circuit failure. While alignment tolerances are provided, these become stricter as the state of the art requires finer feature sizes. In fact, semiconductor processing technology has advanced in part as self-alignment techniques have obviated some photolithographic procedures, reducing opportunities for misalignment. However, self-alignment is not an alternative to photolithography, but rather an enhancement that is added on a case-by-case basis.

Circuit interconnects are particularly vulnerable to misalignment of a dielectric via mask relative to an underlying metal pattern. Perfect alignment provides maximal area for the via to contact the underlying metal. Maximal contact area reduces via resistance and minimizes vulnerability to small defects in the contact between the via and the underlying metal. Imperfect alignment reduces the contact area, increasing via resistance. The reduced contact area also makes it more likely that a small defect will seriously impair the electrical connection. Poor alignment can result in the failure of the via to electrically contact the intended underlying metal feature.

Misalignment is not the only problem facing intermetal vias. When the metal for an upper layer is deposited, the metal must reach the base of a via aperture in sufficient quantity and consistency to ensure a reliable electrical connection between the metal patterns. If the via aperture has a large aspect ratio, i.e., is relatively deep given the area of its cross section, deposited metal can have difficulty filling the via aperture. For example, metal deposited by sputtering can hit and stick to the side walls of the aperture. The sidewall metal then blocks the subsequently sputtered metal from the base of the aperture. The result can be an electrical discontinuity in the via.

This problem of step coverage is reduced when the via apertures have smaller aspect ratios. However, via depth is equated with dielectric thickness, which is bounded from below to ensure the desired electrical isolation between the adjacent conductors. Concomitantly, via cross section is bounded from above by the process feature size. As feature sizes diminish, via depth does not tend to decrease as fast as via cross section. Accordingly, aspect ratios tend to increase with decreasing feature size.

Moreover, dielectric depth can vary due to nonplanarities in the underlying structure. The vias at the deeper dielectric points have aspect ratios that are correspondingly greater than the minimum that is electrically required. According, deposition through large-aspect-ratio via apertures must be addressed.

Spin-on glass can be used to enhance planarization. Unlike deposited oxides that tend to be of uniform thickness, spin-on glass flows so that it is thinner over more elevated regions of an underlying structure, thus partially compensating for nonplanarities. In addition, spin-on glass can be polished to achieve further planarization.

Unfortunately, moisture in the spin-on glass can attack exposed metal. Oxide can be deposited before the spin-on glass is applied to protect the underlying metal pattern. Oxide can be deposited over the spin-on glass to protect the overlaying metal pattern. However, even with these oxide depositions, the spin-on glass can attack the metal vias that extend through it to electrically connect metal patterns.

In summary, as device dimensions have decreased, metal interconnection integrity has been challenged in at least three ways. Misalignment more seriously reduces the contact area between a via and the underlying metal pattern. Step-coverage problems can impair via formation. Moisture from spin-on glass can poison vias after formation. What is needed is an interconnect method in which these problems are reduced or eliminated.

SUMMARY OF THE INVENTION

The present invention defines an intermetal via pattern using the same photoresist mask used to define a lower metal pattern. Via metal is deposited on unpatterned lower metal. A lower metal pattern and a via pattern are concurrently defined using gradient photolithography and a positive photoresist. An intermetal dielectric is formed, optionally including a spin-on glass. Some intermetal dielectric is removed to expose via metal; dielectric removal can involve polishing, blanket etchback and/or a photolithographically patterned etch. Upper metal can then be deposited and patterned. This method is elaborated below.

A lower metal is deposited. In contrast to the prior art, via metal is deposited before the lower metal is patterned and before an intermetal dielectric is formed. Note that metal layers can have sublayers of etch-stop metal, such as titanium tungsten (TiW), and conductor metal, such as aluminum (Al) or aluminum copper (AlCu).

Positive photoresist is applied over the via metal. A gradient exposure, instead of the conventional bi-level exposure, is imposed on the photoresist. The gradient exposure can be implemented using a gradient (gray-scale) mask so that exposure intensity assumes at least three levels; alternatively, the gradient exposure can be implemented using masks in succession, or otherwise varying exposure time and/or intensity by integrated-circuit region. The gradient exposure: 1) exposes a removal-pattern region relatively heavily; 2) exposes a lower-pattern region intermediately; and 3) a via-pattern region relatively lightly, ideally leaving the via-pattern region unexposed.

Development: 1) removes substantially all photoresist from the removal region; 2) leaves an intermediate depth of photoresist in the lower-pattern region; and 3) leaves a relatively deep photoresist in the via-pattern region. Etching then removes from the removal-pattern region any remaining photoresist, via metal and lower metal. Etching also removes from the metal-pattern region any remaining photoresist and at least some of the via metal, while leaving at least some lower metal. Etching removes from the via-pattern region at least some photoresist, leaving at least some via metal and all underlying lower metal. Any remaining photoresist is removed, leaving a three-tiered structure with: 1) the removal-pattern region having no lower or via metal, 2) the lower-pattern region having lower metal; and 3) the viapattern region having lower metal plus via metal.

The intermetal dielectric can be formed in a variety of ways. Preferably, a spin-on glass is used for planarization. Silicon dioxide can be deposited before and after the spin-on glass is applied to protect the underlying metal pattern previously defined and the overlaying metal pattern to be formed. To achieve a minimal overall thickness, a blanket etchback can be implemented before the second silicon dioxide layer is deposited. In contrast to the prior art, the first silicon dioxide deposition protects not only lower metal, but also via metal.

Via metal is then exposed by removing some of the dielectric material. One realization of the present invention requires a masking step to open via apertures over via metal to expose it. Advantageously, the depth of these via apertures, relative to comparable via apertures of the prior art, is reduced by the height of the via metal. In another realization, the via metal is exposed by polishing and/or blanket etch back. In this latter case, no photolithographic procedure is required. In a hybrid realization of the present invention, polishing continues until some via metal is exposed; the remaining via metal is exposed by photolithographically defining via apertures. Once all via metal is exposed, an upper metal layer can be deposited and patterned to complete the metal interconnect structure.

Where no masking step is required to uncover it, via metal reaches the intermetal dielectric top surface. A subsequent upper metal deposition readily achieves good electrical contact with the via metal and there are no alignment problems. If the dielectric is a deposit-spin-deposit sandwich, the metal via is protected from the spin-on glass by the lower deposited dielectric. Thus, the prior art problems of misalignment, step coverage and via poisoning are avoided.

Where photolithographically defined via apertures are required to uncover via metal, concerns about alignment and via integrity arise. However, the via apertures extend down only to the top of the via metal and not all the way to the lower metal. Since the via metal is raised relative to the lower metal, the required via apertures are relatively shallow. Thus, via aperture aspect ratios are reduced, providing enhanced step coverage. Depending on the depth of the via apertures, all or part of the upper metal section of a via is protected from spin-on glass moisture by the lower silicon dioxide deposition.

In addition, since the via apertures do not extend to the lower metal, they can be oversized without risk of shorting adjacent lower metal lines. Alignment tolerances are greatly relaxed for the oversized via.

Accordingly, all described realizations of the present invention at least reduce problems of misalignment, step coverage and via poisoning that plague the prior art. Thus, the present invention enhances electrical connectivity between metal layers of a metal interconnect structure. These and other features and advantages of the present invention are apparent from the description below with reference to the following drawings.

Figure 1:
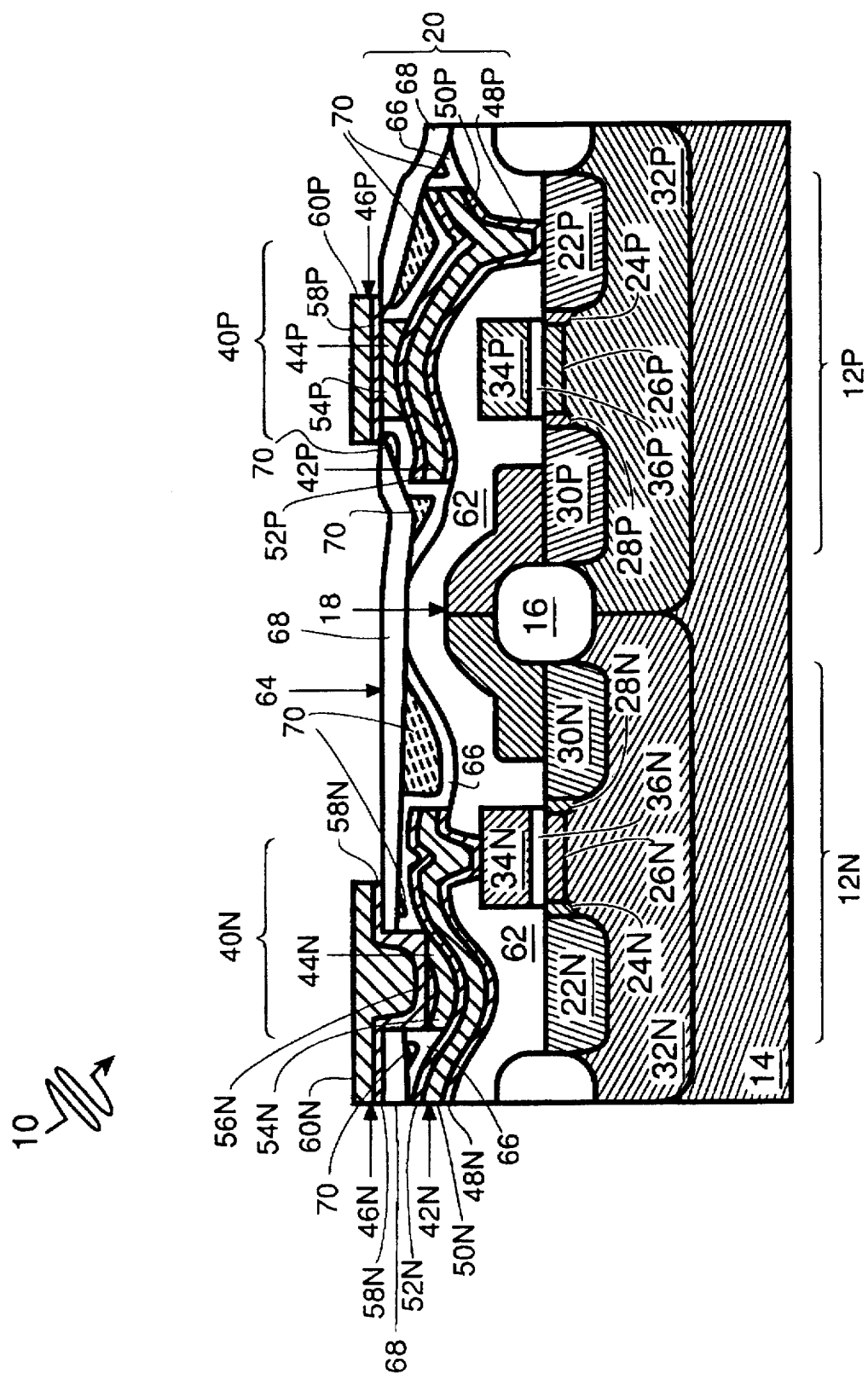
FIG. 1 is a schematic sectional view of a CMOS integrated circuit in accordance with the present invention.

In the drawings, the hatching of the monocrystalline and polycrystalline silicon roughly indicates doping type and concentration. P-type doping is represented by a positive slope and n-type doping is represented by a negative slope. The steepness of the slope roughly correlates with doping concentration. This convention is applied only to semiconductor materials; hatching of conductive and dielectric materials does not indicate conductivity. The hatching for conductors is thicker and more widely spaced than that used for silicon. Spin-on glass is indicated by broken hatching; other dielectrics are not hatched. Substrates and wells are omitted from FIGS. 4 et seq.

DESCRIPTION OF THE PREFERRED EMBODIMENTS

In accordance with the present invention, a CMOS integrated circuit 10 incorporates a novel intermetal via formation, as illustrated in FIG. 1. CMOS integrated circuit 10 includes an n-channel transistor 12N and a p-channel transistor 12P formed in and on a lightly doped n-type crystalline silicon substrate 14. Transistors 12N and 12P are electrically isolated from each other and other devices of CMOS integrated circuit 10 by a field oxide 16. Transistors 12N and 12P are coupled to each other by a local interconnect 18 to define an inverter. Transistors 12N and 12P are coupled to other devices of CMOS integrated circuit 10 by metal interconnect structure 20.

N-channel transistor 12N includes a heavily doped p-type source 22N, a lightly doped p-type source 24N, an n-channel 26N, a lightly doped p-type drain 28N and a heavily doped p-type drain 30N, all formed in an n-well 32N. The conductivity through n-channel 26N is controlled by the voltage at a gate 34N of heavily doped n-type polysilicon. Gate 34N is electrically isolated from n-channel 26N by gate oxide 36N.

P-channel transistor 12P includes a heavily doped n-type source 22P, a lightly doped n-type source 24P, a p-channel 26P, a lightly doped n-type drain 28P and a heavily doped n-type drain 30P, all formed in a p-well 32P. The conductivity through p-channel 26P is controlled by the voltage at a gate 34P of heavily doped p-type polysilicon. Gate 34P is electrically isolated from p-channel 26P by gate oxide 36P.

Metal interconnect structure 20 provides electrical access to active components of CMOS integrated circuit 10. FIG. 1 shows an access structure 40N for gate 34N of n-channel transistor 12N and an access structure 40P for source 22P of p-channel transistor 12P. Metal interconnect structure 20 also provides access to source 22N and to gate 34P, but these are not in the plane of FIG. 1. Metal interconnect structure 20 does not provide access to drains 30N and 30P as these are coupled in an inverter arrangement by polysilicon local interconnect 18, as indicated above.

Access structure 40N includes a lower metalization 42N, a via metalization 44N, and an upper metalization 46N, all electrically coupled to each other and to gate 34N. Lower metalization 42N includes a titanium tungsten (TiW) etch stop 48N, an aluminum copper (AlCu) lower conductor 50N, and another TiW etch stop 52N. Via metalization 44N includes an AlCu via conductor 54N and a TiW etch stop 56N. Upper metalization includes a TiW etch stop 58N and an AlCu conductor 60N.

Access structure 40P includes a lower metalization 42P, a via metalization 44P, and an upper metalization 46P, all electrically coupled to each other and to source 22P. Lower metalization 42P includes a TiW etch stop 48P, an AlCu lower conductor 50P, and another TiW etch stop 52P. Via metalization 44P includes a via AlCu conductor 54P. Upper metalization includes a TiW etch stop 58P and an AlCu conductor 60P.

Metal interconnect structure 20 is electrically isolated generally from devices of integrated circuit 10 by submetal dielectric 62. An intermetal dielectric structure 64 provides for electrical isolation between access structures of integrated circuit 10, including access structures 40N and 40P. Intermetal dielectric structure 64 includes a lower oxide 66 and an upper oxide 68 sandwiching pockets of spin-on glass 70. Metal components are protected from moisture of spin-on glass 70 by lower oxide 66 and upper oxide 68.

In accordance with the present invention, via metalizations 44N and 44P are protected by lower oxide 66 from spin-on glass 70. In particular, lower oxide 66 laterally spaces spin-on glass 70 from via conductors 54N and 54P.

Figure 2:
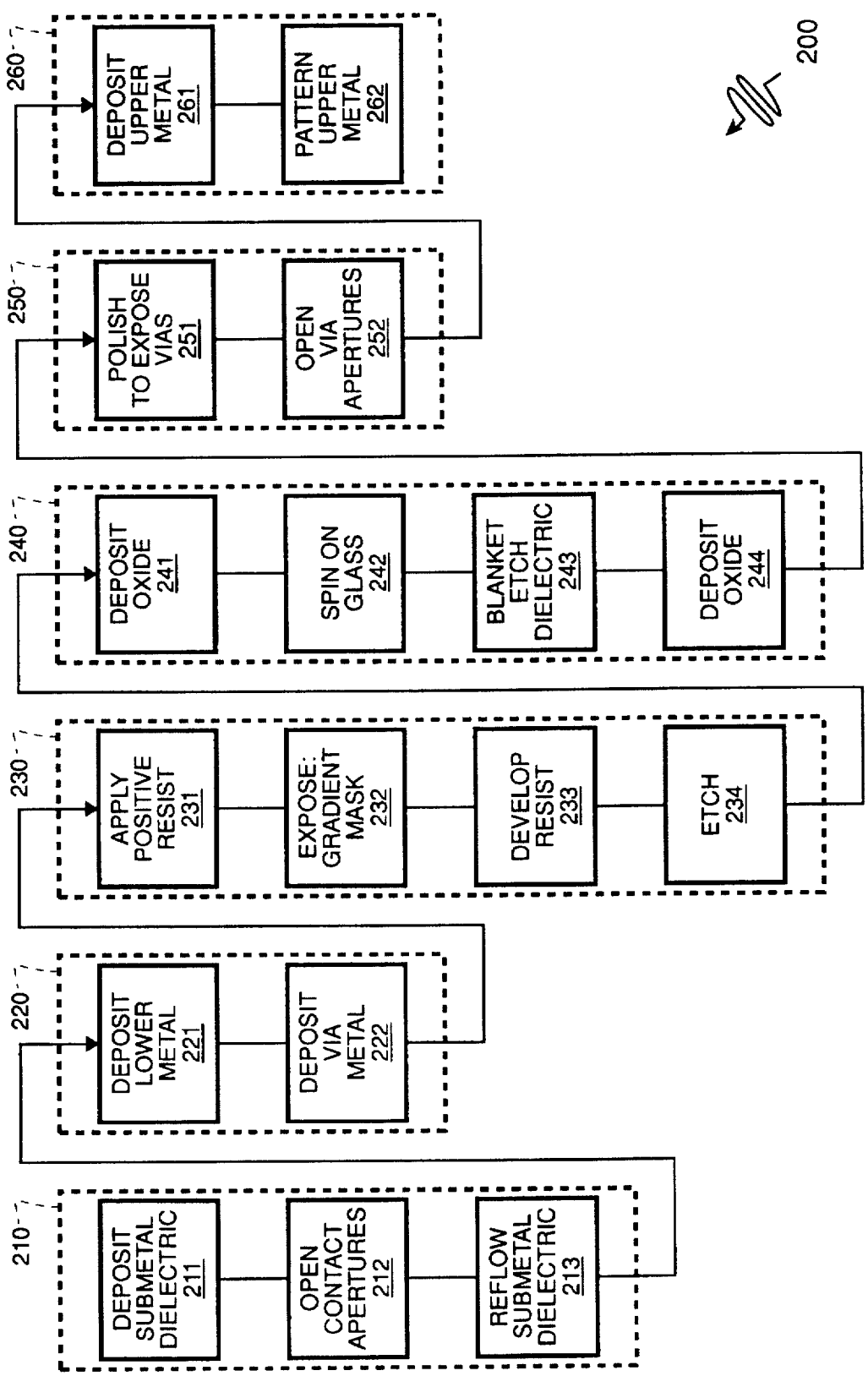
FIG. 2 is a flow chart of a method of the present invention used to fabricate the integrated circuit of FIG. 1.
Figure 3:
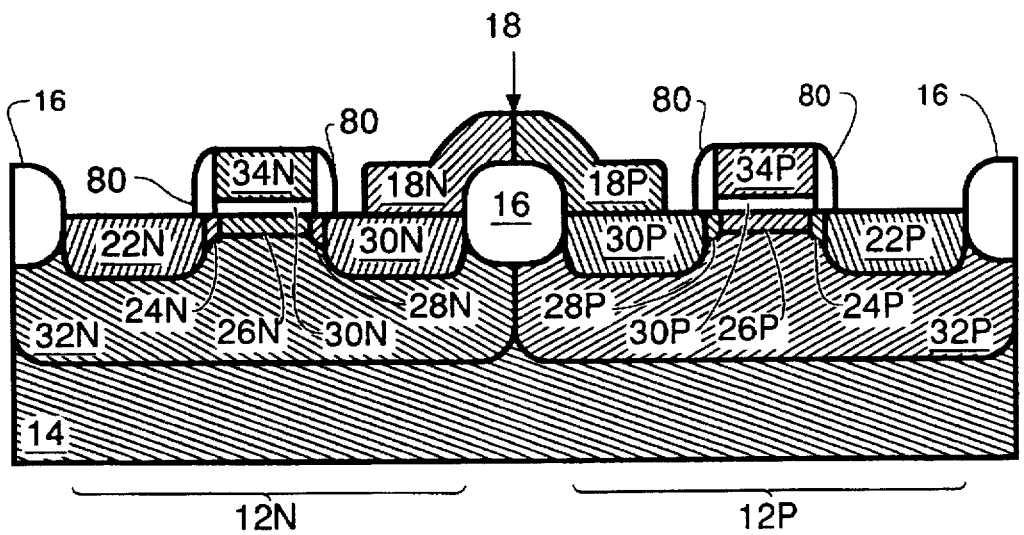
FIG. 3 is a schematic sectional view of a starting structure for the method of FIG. 2.

A method 200 of the present invention provides for fabrication of CMOS integrated circuit 10 as flow charted in FIG. 2. The starting point for method 200, illustrated in FIG. 3, is basically as in FIG. 1 less access structures 40N and 40P, submetal dielectric 62 and intermetal dielectric 64. The structure of FIG. 3 is conventional, so those skilled in art can determine methods for fabricating it.

Sidewall spacers 80 are grown on gates 34N and 34P after the dopants for lightly doped sources and drains 24N, 24P, 28N, and 28P are implanted and before the dopants for heavily doped sources and drains 22N, 22P, 30N, and 30P are implanted so that the latter are separated from respective channels 26N and 26P.

Local interconnect 18 includes heavily doped n-type section 18N and heavily doped p-type section 18P. The alternate doping is an artifact of a "split-poly" methodology that has the undesirable side effect of defining a diode junction at the mutual boundary. Accordingly, local interconnect 18 is capped with a tungsten silicide formation, not separately shown, to short this junction.

Figure 4:
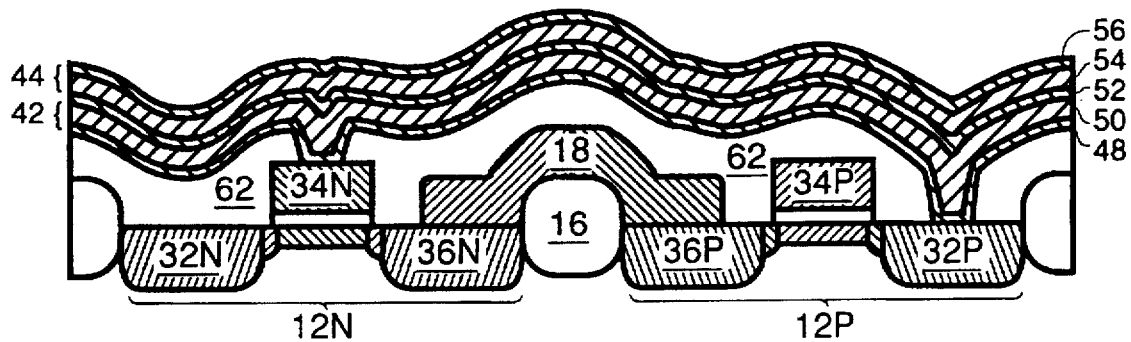
FIG. 4 et seq. are schematic sectional view of the CMOS integrated circuit of FIG. 1 at selected steps of the method of FIG. 2.

Submetal dielectric stage 210 of method 200 provides for submetal dielectric 62. In a step 211, submetal dielectric 62, shown in FIG. 4, is deposited. Submetal dielectric 62 is silicon dioxide doped with boron and phosphorous to enhance its flow characteristics. It can be deposited using a doped tetraethylorthosilicate (TEOS) chemical vapor deposition (CVD). Sidewalls 80 are for all practical purposes merged with submetal dielectric 62 and so are not separately indicated other than in FIG. 3.

After submetal dielectric 62 is deposited, contact apertures are photolithographically defined, at step 212, to provide contact access to circuit devices. As indicated in FIG. 4, contact apertures are formed over gate 34N and source 32P. Contact apertures are also formed over gate 28P and source 32N, but these are out of the plane of FIG. 4.

After the contact apertures are formed, the structure is heated to 875° C. to reflow submetal dielectric 62 at step 213. The original sharp edges of the contact apertures soften to provide a gently sloping contact aperture sidewall. In addition, some planarization occurs across submetal dielectric 62. The planarization facilitates subsequent depositions. The contact-aperture softening facilitates contact metal coverage within the contact aperture. It is noted that this reflow technique is not available for via apertures through intermetal dielectric structure 64 since the heat required for reflow would melt previously deposited metals.

Metal deposition stage 220 provides lower metal and via metal depositions. Lower metal deposition, at step 221, provides lower metal layer 42. Titanium tungsten (TiW) is sputtered to form etch stop layer 48 that physically contacts gate 34N and source 32P. Aluminum copper (AlCu) is sputtered to form lower conductor layer 50. TiW is sputtered again to form etch stop layer 52, thus completing lower metal layer 42.

Via metal deposition follows directly at step 222 to provide via metal layer 44. This involves AlCu deposition to form conductor layer 54, and TiW deposition to form etch stop layer 56. The resulting structure is shown in FIG. 4.

The deposition of via metal before patterning of the lower metal contrasts with conventional prior art. Conventionally, lower metal layers are patterned, intermetal dielectric is formed, via apertures are defined, and an upper metal is deposited. The vias would be formed concomitantly with the upper metal deposition.

Photoresist stage 230 begins with the application of positive photoresist 82 at step 231. A gradient exposure is made at step 232. The gradient exposure is made using a gradient reticle with transparent, opaque and intermediately transmissive areas corresponding respectively to a removal-pattern region 88 that is eventually free of lower metal and via metal, a lower-pattern region 86 that retains lower metal only, and a via-pattern region 84 that retains both lower metal and at least some via metal. This gradient reticle provides for heavy exposure of removal-pattern region 88, moderate exposure in metal-pattern region 86, and a relatively light exposure for via-pattern region 84. For purposes herein, "relatively light exposure" includes nonexposure.

Alternatively, different gradient exposure methods can be used. For example, two masks can be used in sequence, one with an opaque metal pattern, and the other with an opaque via pattern.

Figure 5:
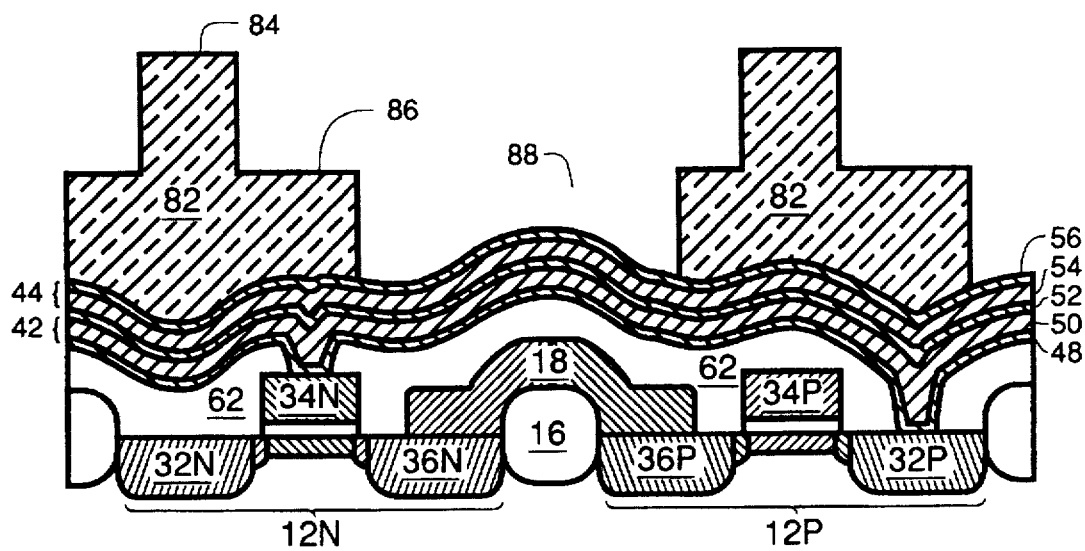

Upon photoresist development at step 233, photoresist 82 is left at greatest thickness in via-pattern region 84 where via is to be formed, and at intermediate thickness in lower-pattern regions 86, where the lower metal pattern is to be. Photoresist is removed or at its thinnest in removal-pattern region 88 from which the full thickness of lower metalization 42 is to be removed. The resulting structure is shown in FIG. 5.

Figure 6:
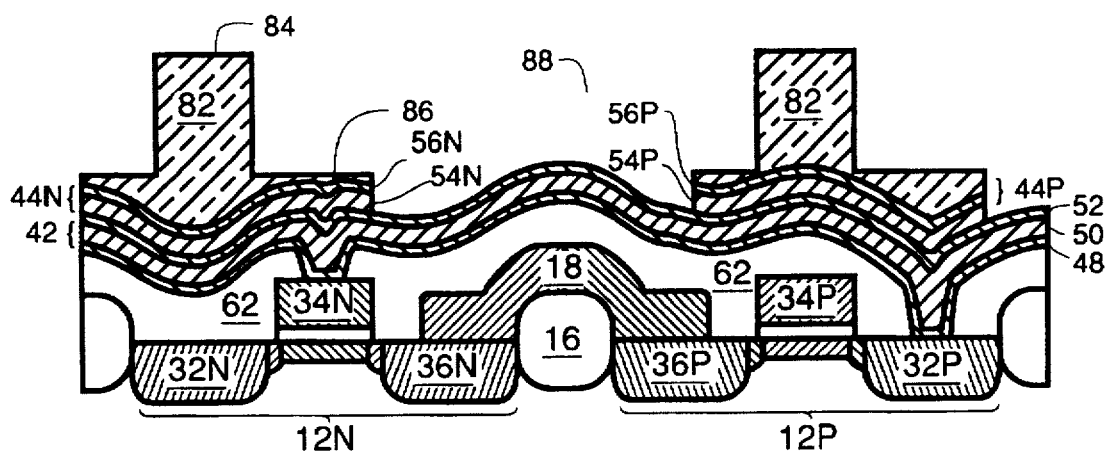

The photoresist pattern is transferred to lower metal layer 42 and via metal layer 44 by an etch sequence at step 234. The etch is controlled by alternating between: 1) etches that are most effective removing TiW and 2) etches that are most effective removing AlCu. FIG. 6 shows an intermediate point of etch step 234 in which the via pattern remains covered with relatively thick photoresist and the via metal has assumed the lower metal pattern. Accordingly, via metal sections 44N and 44P have been defined. Via metal section 44N includes AlCu layer 54N and TiW layer 56N; via metal section 44P includes AlCu layer 54P and TiW layer 56P.

Figure 7:
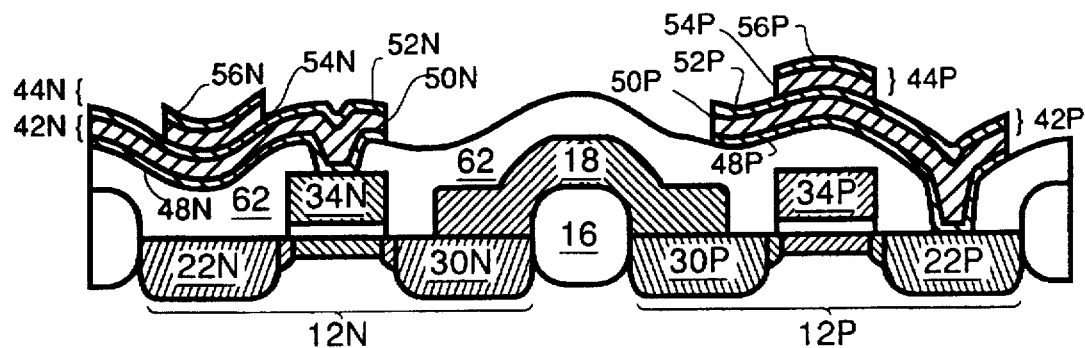

The result of etch step 234 is shown in FIG. 7. The via pattern is imposed on what was via layer 44 so as to define metal features 44N and 44P; the lower metal pattern is imposed on what was lower metal layer 42 to define metal features 42N and 42P. Accordingly, layers 48N, 48P, 50N, 50P, 52N, 52P, 54N and 54P essentially assume their final forms. Via etch stops 56N and 56P are partially or completely removed in later steps. These etch steps may also incidentally remove parts of via metal layers 54N and 54P.

Intermetal dielectric stage 240 begins with a CVD silicon dioxide deposition at step 241. The resulting silicon dioxide layer 66, shown in FIG. 8, has essentially uniform thickness, thus maintaining the uneven surface of the underlying structure.

Figure 8:
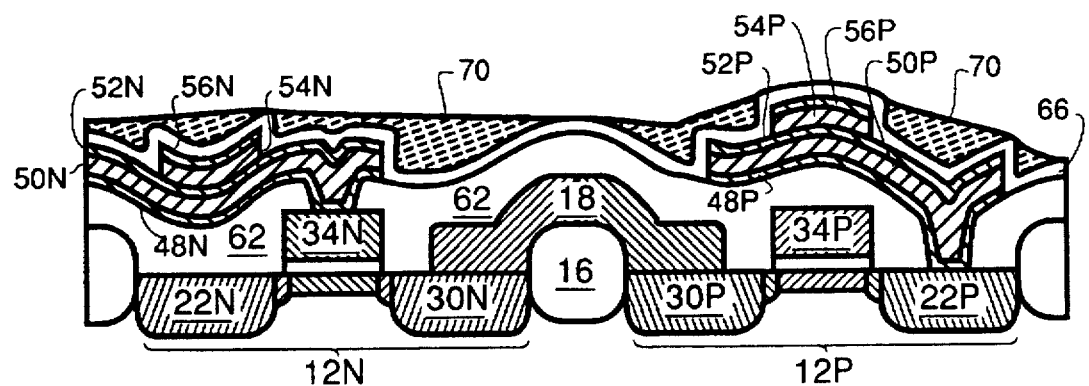

A silanol monomer formulation is spun on the structure silicon dioxide layer 66 at step 242. The formulation is thermally polymerized and baked to remove most of the water and other solvents in the monomer formulation. The resulting spin-on glass 70 tends to planarize the underlying structure, as indicated in FIG. 8.

A blanket etch back is performed at step 243. This etch back can continue until metal is exposed and even partially etched. During this etch back, etch stop 56P is partially removed, while deeper etch stop 56N remains intact. A CVD silicon dioxide deposition is performed at step 244, providing silicon dioxide layer 68. The resulting structure is shown in FIG. 9.

Figure 9:
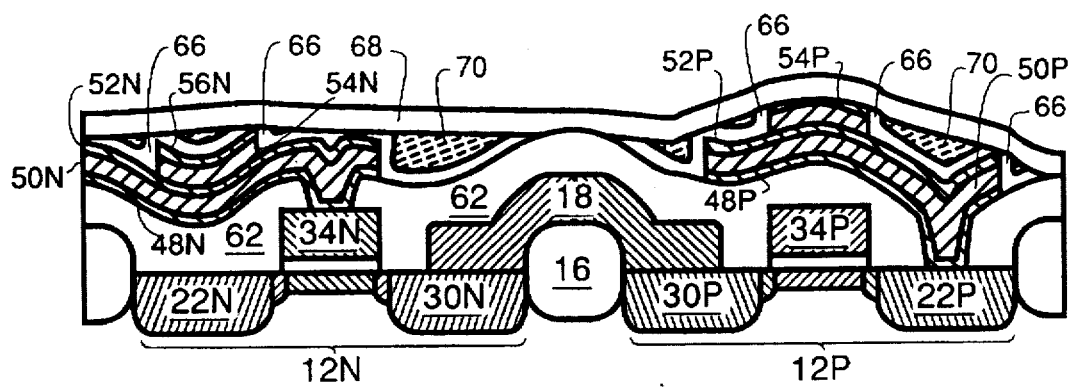

As shown in FIG. 9, spin-on glass 70 has been divided into pockets by etch back step 243. Note that via conductors 54N and 54P are physically separated from spin-on glass 70 by lower intermetal silicon dioxide layer 66. As a result, via poisoning by moisture from spin-on glass is prevented or at least inhibited.

Figure 10:
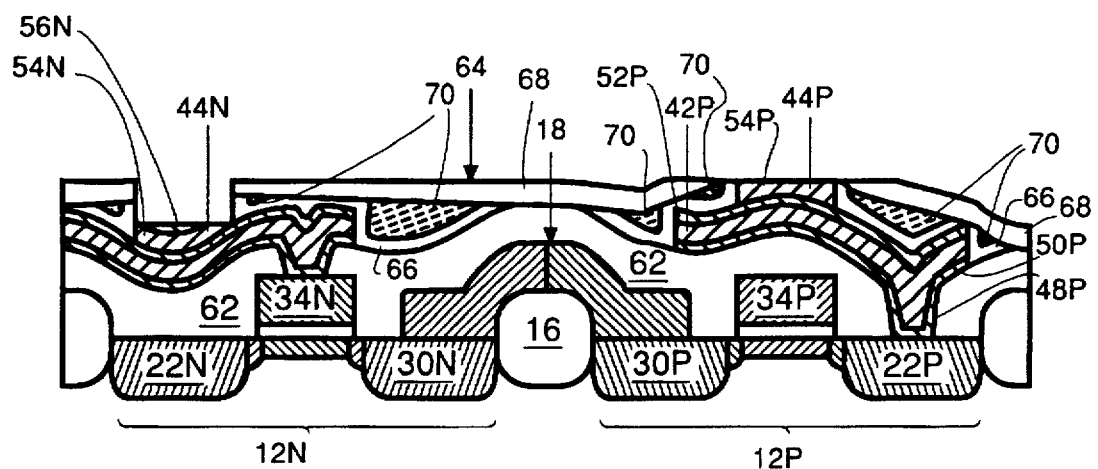

Via exposure stage 250 begins with the polishing, at step 251, of the structure of FIG. 9. This polishing further planarizes the structure, aiding the integrity of the subsequent upper metal deposition. In step 251, the polishing is mechanical, but chemical polishing can be used in the alternative. Polishing continues until at least some via metal is exposed. Due to nonplanarities, some via metal continue to be unexposed. Thus, via 44P is exposed, while via 44N is not. Accordingly, via apertures are photolithographically defined at step 252 to expose the buried vias such as via 44N. The resulting structure is shown in FIG. 10. As an alternative to polishing, a blanket etch can be used to expose via metal.

Stage 250 is pivotal in defining two variations of the present invention. In one variation, polishing and/or etching exposes all vias. In the other variation, the vias are left unexposed. In the latter case, via apertures must be defined. The illustrative embodiment is a hybrid in that some vias are exposed by polishing and others are exposed by via aperture definition. In the hybrid case, as long as the device topology is well characterized, via apertures can be defined only for vias that are not exposed by the polishing.

Upper metal definition stage 260 provides an upper metal features 46N and 46P. Step 261 provides an upper-metal etch-stop layer and an upper-metal conductor layer. The upper-metal etch-stop is provided by sputtering TiW. AlCu is deposited to form the upper-metal conductor layer, as well as partial vias where via apertures have been defined.

Figure 11:
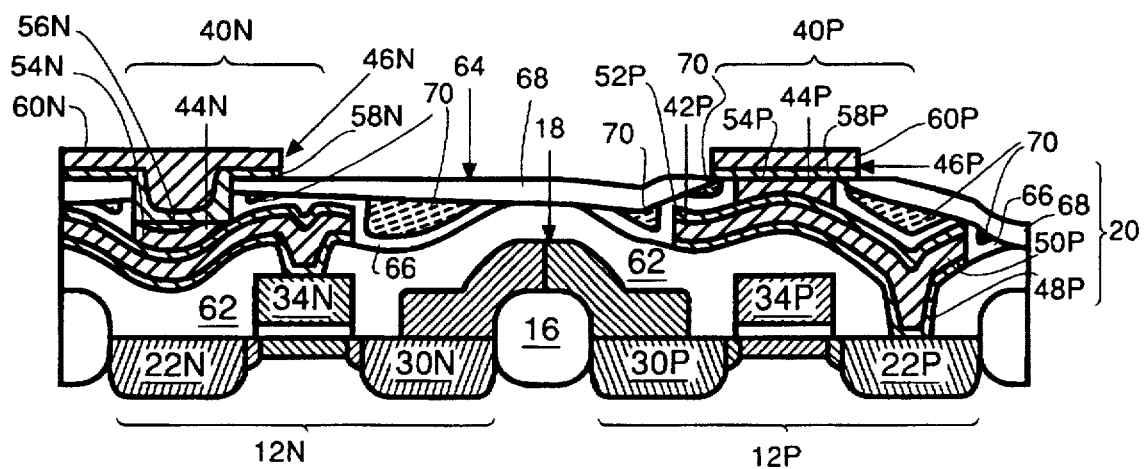

The resulting upper metal structure is photolithographically patterned, at step 262, yielding upper metalizations 46N and 46P, completing access structures 40N and 40P. Note that upper metal feature 46N extends into intermetal dielectric 64, combining with via metal 44N to provide an intermetal via. The resulting metal interconnect structure 20 is shown in FIG. 11. The completed inverter is shown with substrate 14 in FIG. 1.

Additional intermetal dielectrics and metalization layers can be added using method 200, stages 220 to 260. The final structure can be passivated using additional silicon dioxide and/or silicon nitride layers. These and other modifications to and variations upon the preferred embodiments are provided for by the present invention, the scope of which is limited only by the following claims.

I claim:

1. A method of forming a metal interconnect structure in an integrated circuit, said method comprising the steps of:

depositing a lower metal layer over a submetal dielectric;

depositing a via metal layer over said lower metal layer;

applying positive photoresist over said via metal layer;

exposing said photoresist so that a removal-pattern region of said photoresist is relatively heavily exposed, a via-pattern region of said photoresist is relatively lightly exposed, and a lower-pattern region of said photoresist is relatively moderately exposed;

developing said photoresist;

etching so as to remove said lower and via metal layers from said removal-pattern region, remove said via metal layer from said lower-pattern region while leaving at least some thickness of said lower metal layer in said lower-pattern region, and leaving at least some of said via metal layer in said via-pattern region;

forming intermetal dielectric over the structure resulting from said etching;

forming via openings through said dielectric to expose at least some of said via metal layer in said via-pattern region;

depositing an upper metal layer on said intermetal dielectric so as to contact said via metal layer in said via-pattern region; and photolithographically patterning said upper metal layer to form a relief pattern therein;

whereby said via metal layer constitutes at least part of a via between said lower metal layer and said upper metal layer.

2. A method as recited in claim 1 wherein said step of forming said intermetal dielectric involves:

depositing a first oxide;

spinning on glass over the structure resulting from said first oxide; and depositing a second oxide.

3. A method as recited in claim 2 wherein said step of forming said intermetal dielectric involves performing a blanket etch after spinning on said glass and before depositing said second oxide.

4. A method of forming electrical connections among integrated circuit devices, said method comprising the steps of:

depositing a retowable submetal dielectric;

opening contact apertures in said submetal dielectric to expose active regions of said circuit devices;

reflowing said submetal dielectric so as to round the edges of said contact apertures;

depositing a lower metal layer by depositing a first etch-stop sublayer, depositing a lower-metal conductor sublayer, and depositing a second etch-stop sublayer;

depositing a via metal layer by depositing a via conductor sublayer, and depositing a third etch-stop sublayer;

applying positive photoresist over said third etch-stop sublayer;

exposing said photoresist so that a removal-pattern region of said photoresist is relatively heavily exposed, a via-pattern region of said photoresist is relatively lightly exposed, and a lower-pattern region of said photoresist is relatively moderately exposed;

developing said photoresist;

etching so as to remove said lower and via metal layers from said removal-pattern region, remove said via metal layer from said lower-pattern region while leaving at least some thickness of said lower metal layer in said lower-pattern region, and leaving at least some of said via metal layer in said via-pattern region;

forming an intermetal dielectric by depositing a first oxide, spinning on glass, blanket etching back the structure resulting from said spinning on glass, and depositing a second oxide;

polishing until at least some of said via metal layer is exposed;

opening via apertures through said intermetal dielectric to expose via metal layer not exposed by said polishing;

depositing an upper metal layer by depositing an etch-stop metal sublayer, and depositing an upper-metal conductor sublayer; and photolithographically patterning said upper metal layer so as to form a relief pattern therein;

whereby said via metal layer constitutes at least part of a via between said lower metal layer and said upper metal layer, and said upper metal layer constitutes at least part of a via between said lower metal layer and said upper metal layer.

* * * * *